United States Patent [19]

Vicari et al.

[11] Patent Number: 5,342,727
[45] Date of Patent: Aug. 30, 1994

[54] COPOLYMERS OF 4-HYDROXYSTYRENE AND ALKYL SUBSTITUTED-4-HYDROXYSTYRENE IN ADMIXTURE WITH A PHOTOSENSITIZER TO FORM A PHOTOSENSITIVE COMPOSITION

[75] Inventors: Richard Vicari, Chatham; Douglas J. Gordon, Somerville, both of N.J.; William D. Hinsberg, Fremont, Calif.; Dennis R. McKean, San Jose, Calif.; Carlton G. Willson, San Jose, Calif.; Ralph Dammel, Klein-Winternheim, Fed. Rep. of Germany

[73] Assignees: Hoechst Celanese Corp., Somerville, N.J.; IBM Corp., Armonk, N.Y.

[21] Appl. No.: 812,878

[22] Filed: Dec. 20, 1991

Related U.S. Application Data

[63] Continuation of Ser. No. 535,078, Jun. 8, 1990, abandoned, Continuation-in-part of Ser. No. 260,841, Oct. 21, 1988, abandoned.

[51] Int. Cl.$^5$ .................. G03F 7/021; G03F 7/09
[52] U.S. Cl. ..................... 430/157; 430/165; 430/167; 430/176; 430/191; 430/192; 430/193; 430/196; 430/197; 430/270; 430/272; 430/277; 430/278
[58] Field of Search ............ 430/192, 193, 165, 166, 430/270, 197, 191, 162, 157, 167, 176, 196, 272, 277, 278

[56] References Cited

U.S. PATENT DOCUMENTS

| | | | |
|---|---|---|---|
| 2,276,138 | 3/1942 | Alderman | 260/85 |
| 2,687,422 | 8/1954 | Overberger | 260/410.5 |
| 3,624,134 | 2/1970 | Kablaoui | 260/479 R |
| 3,869,292 | 3/1975 | Peters | 96/115 R |
| 3,963,495 | 3/1975 | Kato et al. | 96/76 R |
| 3,963,662 | 6/1976 | Fujiwara et al. | 260/29.6 WB |
| 3,970,534 | 7/1976 | Fujiwara et al. | 204/159.17 |
| 4,100,140 | 7/1978 | Zahir | 526/90 |
| 4,144,063 | 3/1979 | Haas | 96/290 |
| 4,221,700 | 9/1980 | Minagawa et al. | 260/45.7 PH |
| 4,298,720 | 11/1981 | Yamazaki et al. | 526/262 |

(List continued on next page.)

FOREIGN PATENT DOCUMENTS

0140273 5/1985 European Pat. Off. .
0187517 7/1986 European Pat. Off. .

OTHER PUBLICATIONS

Hanrahan, M. J. and Hullis, K. S.; SPIE vol. 771 (1987), pp. 128–135 "A Comparison of the dissolution behavior of poly(hydroxystyrene) with novolac".

(List continued on next page.)

Primary Examiner—Charles L. Bowers, Jr.
Assistant Examiner—John S. Chu
Attorney, Agent, or Firm—James L. McGinnis

[57] ABSTRACT

A copolymer of (a) an unsubstituted 4-hydroxystyrene monomer and (b) a substituted 4-hydroxystyrene monomer of the formula

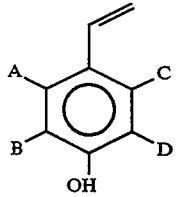

wherein A, B, C, and D are independently H or $C_1$ to $C_4$ alkyl and wherein at least one of B and D is $C_1$ to $C_4$ alkyl; and wherein said copolymer has a molecular weight of from about 800 to about 100,000; and wherein the mol ratio of monomer (a) to monomer (b) ranges from about 3:1 to about 1:3.

18 Claims, No Drawings

U.S. PATENT DOCUMENTS

| | | | |
|---|---|---|---|
| 4,388,451 | 6/1983 | Culbertson et al. | 526/271 |
| 4,404,272 | 9/1983 | Stahlhofen | 430/192 |
| 4,439,516 | 3/1984 | Cernigliaro et al. | 430/323 |
| 4,451,676 | 5/1984 | Everly | 568/780 |
| 4,544,704 | 10/1985 | Hefner, Jr. | 525/108 |
| 4,550,069 | 10/1985 | Pampalone | 430/165 |
| 4,551,409 | 11/1985 | Gulla et al. | 430/192 |
| 4,564,575 | 1/1986 | Perreault et al. | 430/165 |
| 4,565,846 | 1/1986 | Saito et al. | 525/101 |
| 4,587,196 | 5/1986 | Toukhy | 430/192 |
| 4,600,683 | 7/1986 | Greco et al. | 430/270 |
| 4,650,741 | 3/1987 | Miura et al. | 430/192 |
| 4,663,268 | 5/1987 | Turner | 430/270 |
| 4,678,737 | 7/1987 | Schneller et al. | 430/270 |
| 4,719,167 | 1/1988 | Miura et al. | 430/192 |
| 4,720,445 | 1/1988 | Brahim et al. | 430/192 |
| 4,725,523 | 2/1988 | Miura et al. | 430/192 |
| 4,731,319 | 3/1988 | Kohara et al. | 430/165 |
| 4,764,450 | 8/1988 | Ruckert et al. | 430/191 |
| 4,857,435 | 8/1989 | Hopf et al. | 430/192 |
| 4,963,463 | 10/1990 | Koshiba et al. | 430/165 |
| 4,988,601 | 1/1991 | Ushirogouchi et al. | 430/165 |

OTHER PUBLICATIONS

Jones, J. A. and Ottenbrite, R. M.; Journal of Polymer Chemistry vol. 24, pp. 1487–1595 (1986)—"Preparation and Structural Characterization of Poly (4-vinylphenylacetate-co-maleic anhydride)".

Arshady, R. and Kenner, G. W., Journal of Polymer Science vol. 12, (pp. 2017–2025) 1974; "Phenolic Resins for Solid-Phase Synthesis:Copolymerization of Styrene and p-acetoxystyrene".

Packman, D. I.; 1964; "Chelating Polymers Derived from Poly(4-hydroxystyrene)".

Turner, S. R. et al.; Polymer Engineering and Science, Sep. 1986 "High-Tg Base Soluble Copolymers as Novolac Replacements for Positive Photoresists".

Isaks, Martin and Yates, Keith, Journal of the American Chemical Society 1984, 106, pp. 2728–2730 Photohydration via Intramolecular Proton Transfer to Carbon in Electronically Excited States.

Hewgill, Richmond F. and Smith, Warren T.; Journal of Polymer Science vol. 14, 1976, pp. 463–465 (1976)—"An Alternative Route To Stable Aryloxy Polyradicals".

Matsuzawa, T. and Tomioka, H., IEEE Electron Device Letters, vol. EDL-2, No. 4, Apr. 1981, pp. 90–91; "Steep Profile Resist Patterns through 1:1 Deep UV Projection Printing".

Matsuzawa, Toshiharu et al.; IEEE Transactions on Electron Devices vol. ED—30, No. 12, Dec. 1983–pp. 1780–1783–"Optimization of the Composition of a New MRS-Type Negative Resist".

Wilson, C. Grant, et al.; SPIE vol. 771 Advances in Resist Technology and Processing IV (1987), pp. 2–10; "New Diazoketone Dissolution Inhibitors for Deep U.V. Photolithography".

McKean, Dennis R., et al.; IBM Research Division, Almaden Research Center "Novolac based deep UV resists".

Pampalone T. R.; Solid State Technology–Jun. 1984–"Novolac Resins Used in Positive Resist Systems".

Pol, Victor; Solid State Technology—Jan. 1987, pp. 71–76 "High Resolution Optical Lithography; A Deep Ultraviolet Laser-Based Wafer Stepper".

Grant, Barbara D. et al.; IEEE Transactions on Electron Devices; vol. ED-28, No. 11, Nov. 1981, pp. 1300–1305–"Deep UV Photoresists I. Meldrum's Diazo Sensitizer".

Gipstein, E. et al.; Journal of the Electrochemical Society, vol. 129, No. 1, pp. 201–205–"Evaluation of Pure Novolsk Cresol-Formaldehyde Resins for Deep U.V. Lithography".

COPOLYMERS OF 4-HYDROXYSTYRENE AND ALKYL SUBSTITUTED-4-HYDROXYSTYRENE IN ADMIXTURE WITH A PHOTOSENSITIZER TO FORM A PHOTOSENSITIVE COMPOSITION

CROSS REFERENCE TO RELATED APPLICATION

This application is a continuation of prior U.S. application Ser. No. 07/535,078, filed Jun. 8, 1990, now abandoned, which is a continuation in part of U.S. patent application Ser. No. 07/260,841, filed Oct. 21, 1988, now abandoned which is incorporated herein by reference.

BACKGROUND OF THE INVENTION

The present invention relates to novel copolymers which are copolymers of 4-hydroxystyrene and alkyl substituted 4-hydroxystyrene. This copolymer has been found to be useful in various applications such as binder resins for photoresists.

In a preferred embodiment the invention relates to poly(3,5-dimethyl-4-hydroxystyrene-co-4-hydroxystyrenes) which have a molecular weight in the range of from about 800 to about 100,000 and are suitable as compounds which serve as binder resins in radiation-sensitive mixtures.

It is well known in the art to produce positive photoresist formulations such as those described in U.S. Pat. Nos. 3,666,475, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired. Polyvinyl phenols are taught in U.S. Pat. Nos. 3,869,292 and 4,439,516.

U.S. Pat. No. 4,075,237 describes methyl-1,4-dimethyl-2-hydroxystyrene, while U.S. Pat. No. 4,565,846 teaches the use of poly(3,5-dimethyl-4-hydroxystyrene). U.S. Pat. No. 4,221,700 describes a stabilized synthetic polymer composition using poly(alkylated alkenylphenol) including poly(2-methyl paravinyl phenol). U.S. Pat. Nos. 4,600,683 and 4,543,397 describe poly(alpha-methyl vinyl phenol). U.S. Pat. Nos. 4,517,028; 4,460,770 and 4,539,051 describe poly(dimethyl vinyl phenol). The resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

The overwhelming majority of commercial lithographic resists perform on the basis of this dissolution inhibition principle. This method uses a resin into which one or more components are added to impede the development of the resin. During exposure or some other processing step the inhibition mechanism is destroyed allowing discrimination in development rates between the exposed and unexposed portions of the resist film.

Novolac resin is the most widely used photoresist resin since it combines the desirable aqueous base development rates with the high reactive ion etch resistance associated with aromatic polymers. However for optical lithography, the use of novolac is limited to radiation at wavelengths longer than 300 nm because of its high absorbance at shorter wavelength. The adverse effect of absorbance results in resist images with severely sloping wall profiles. Phenolic resin use is acceptable for deep-uv lithography only if desirable dissolution properties can be combined with high optical transmission.

Other aromatic phenolic resins have been tried in order to overcome the limitations of novolacs. P-cresolic novolac resins were prepared and it was found that the deep-uv optical properties were improved over regular novolac. However the dissolution rates for resists prepared from these resins were not optimal for lithographic applications.

Nearly complete sensitizer destruction was necessary to obtain reasonable dissolution rates for exposed films. As a result, the sensitivity requirement was too great for practical usage.

Poly(4-vinylphenol) has improved optical properties compared to novolacs but the dissolution inhibition of this resin is disadvantageous. Moreover, the discrimination between exposed and unexposed development rates is quite low with diazonaphthoquinone sensitizers. The rate of dissolution can be altered by incorporation of alkyl substituents on the phenolic pendant groups of poly(4-vinylphenol) without any ill effect on the optical characteristics. The affect of various alkyl substituents showed that alkyl groups do affect the interaction energy and can be used to effect the dissolution properties.

Poly(2,6-dimethyl-4-vinylphenol) has been prepared and evaluated for lithographic application. While the optical characteristics were within the acceptable range, the dissolution kinetics were disadvantageously slow. Reasonable dissolution rates could only be obtained by the use of strong alkali developers which also had undesirable effects on metals used in the relevant processes.

We now find that copolymers comprised of varying ratios of 4-vinylphenol and alkyl substituted 4-vinylphenol are able to combine acceptable optical properties with desirable dissolution kinetics. The alkyl groups can be any of a number of substituents and one or more of these groups can be incorporated at the 2, 3, 5, or 6 positions of 4-vinylphenol. The polymer can be comprised of varying ratios of 4-vinylphenol and one or more alkyl substituted 4-vinylphenol. The ratio of monomer units in the polymer is used as a means of controlling the polymer properties. Increasing the percentage of 4-vinylphenol increases the development rate whereas the alkyl substituted units retard the rate. Furthermore, a variety of molecular weight ranges of these materials can be prepared and blended to produce optimal dissolution properties.

As an example of this approach, the 1:1 copolymer of 4-vinylphenol and 2,6-dimethyl-4-vinylphenol is prepared.

One micron films of these copolymers have an optical density of 0.2 at 254 nm. The improvement over novolac ($0.5 um^{-1}$) is very significant and makes deep-uv lithography possible. Furthermore the materials show a higher glass transition temperature (160° C.) than novolac (Tg=90°-120° C.) which extends the useful temperature range of these materials without the need for crosslinking.

In most instances, the exposed and developed substrate will be subjected to treatment by a substrate etchant solution. The photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern on the mask, stencil, template, etc., that was used to create selective exposure patterns on the coated substrate prior to development.

The relief pattern of the photoresist on the substrate produced by the method described above is useful for various applications including as an exposure mask or a pattern such as is employed in the manufacture of miniaturized integrated electronic components. The properties of a photoresist composition which are important in commercial practice include the photospeed of the resist, development contrast, resist resolution, and resist adhesion. Resist resolution refers to the capacity of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Photoresists are generally categorized as being either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. While negative resists are the most widely used for industrial production of printed circuit boards, positive resists are capable of much finer resolution and smaller imaging geometries. Therefore, positive resists are the choice of the manufacture of densely packed integrated circuits. Hence the invention provides novel polymers and photographic compositions employing these polymers. In one important aspect of the invention, it has been found that photoresists which employ the aforesaid polymer as a binder resin show comparable development and dissolution properties to phenol formaldehyde novolak resins but an advantageously lower dissolution rate than polyvinyl phenols which are also known for this purpose.

As hereinbefore mentioned, the polyvinyl phenols have the disadvantage of faster dissolution, which makes image differentiation more difficult to attain. However, they are capable of withstanding much higher processing temperatures, on the order of about 200° C., than the novolaks. The preferred poly(3,5-dimethyl-4-hydroxystyrene-co-4-hydroxy styrene) of this invention demonstrates a dissolution rate comparable to the novolaks and can withstand processing temperatures comparable to the polyvinyl phenols. It is an improvement over poly (4-hydroxy styrene) which typically can only be produced in a low molecular weight, off-color, impure form.

This presents the goal of preparing copolymers for use in a mixture with the other components of a radiation-sensitive mixture and not having the above-described disadvantages of the prior art resists. The nature of the alkyl group can be used to control the dissolution rate of the resin in aqueous base. While the homopolymers of alkyl-4-vinylphenol proved to be too sluggish, copolymers of 4-vinyl phenol and alkyl substituted 4-vinylphenol are observed to have acceptable dissolution rates. Furthermore, the thermomechanical properties of this material are greater than those of novolac and thus higher temperature processes can be carried out without concern over distortion of the image due to flow.

SUMMARY OF THE INVENTION

The invention provides a copolymer of (a) an unsubstituted 4-hydroxystyrene monomer and (b) a substituted 4-hydroxystyrene monomer of the formula

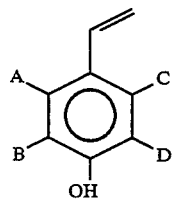

wherein A, B, C, and D are independently H or $C_1$ to $C_4$ alkyl and wherein at least one of B, and D is $C_1$ to $C_4$ alkyl; and wherein said copolymer has a molecular weight of from about 100 to about 100,000; and wherein the mol ratio of monomer (a) to monomer (b) ranges from about 3:1 to about 1:3.

The invention also provides a photosensitive composition comprising the aforementioned copolymer and a photosensitive component. The photosensitive composition is coated on a suitable substrate to form a photosensitive element.

The invention also provides a method for preparing a copolymer of (a) an unsubstituted 4-hydroxystyrene monomer and (b) a substituted 4-hydroxystyrene monomer of the formula

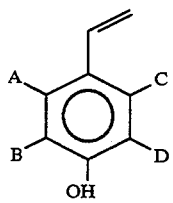

which comprises either
a 1) acylating a substituted phenol to provide a substituted hydroxyacetophenone; or
a 2) substituting a 4-hydroxyacetophenone, to provide a compound with the general formula

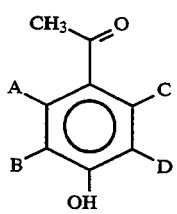

followed by b) esterification of the hydroxyl function to form a 4-acetoxyacetophenone derivative,
c) reduction of the ketone function to a hydroxyl function,
d) dehydration to form a substituted 4-acetoxystyrene;
e) free radical copolymerizing the substituted 4-hydroxystyrene with unsubstituted 4-acetoxystyrene; and
f) hydrolysis of the poly (substituted-4-acetoxystyrene-co-unsubstituted 4-acetoxystyrene) to form poly(substituted-4-hydroxystyrene-co-unsubstituted 4-hydroxystyrene), wherein A, B, C and D are independently H or $C_1$ to $C_4$ alkyl and wherein at least one of A, B, C and D is $C_1$ to $C_4$ alkyl; and wherein said copolymer has a molecular weight of from about 800 to about 100,000; and wherein the mol ratio of monomer (a) to monomer (b) ranges from about 3:1 to about 1:3.

DETAILED DESCRIPTION OF THE PREFERRED EMBODIMENT

In the preferred embodiment, the substituted 4-hydroxystyrene monomer is 3,5-substituted. The preferred 3,5-substitution for this invention is methyl and the preferred embodiment will now be described in detail. The other substitutions are obtained analogously.

In the process for the production of 3,5-dimethyl-4-acetoxystyrene monomer, one may begin with commercially available 2,6-dimethyl phenol and esterify it with acetic anhydride to produce 2,6-dimethyl phenyl acetate. Then, via a Friedel-Crafts catalysis or Fries rearrangement this is converted to 3,5-dimethyl-4-hydroxy acetophenone. The 3,5-dimethyl-4-hydroxy acetophenone is then esterified with acetic anhydride. The latter is then hydrogenated to form 1-(3,5-dimethyl-4-acetoxyphenyl)ethanol. This is then dehydrated with an acid to form 3,5-dimethyl-4-acetoxystyrene monomer, copolymerized with unsubstituted 4-acetoxystyrene, and hydrolyzed to produce poly (3,5,-dimethyl-4-hydroxystyrene-co-4-hydroxystyrene).

A typical reaction sequence may be described schematically as follows:

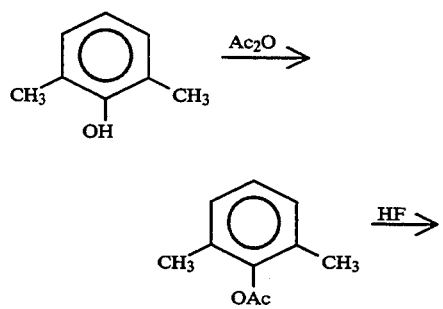

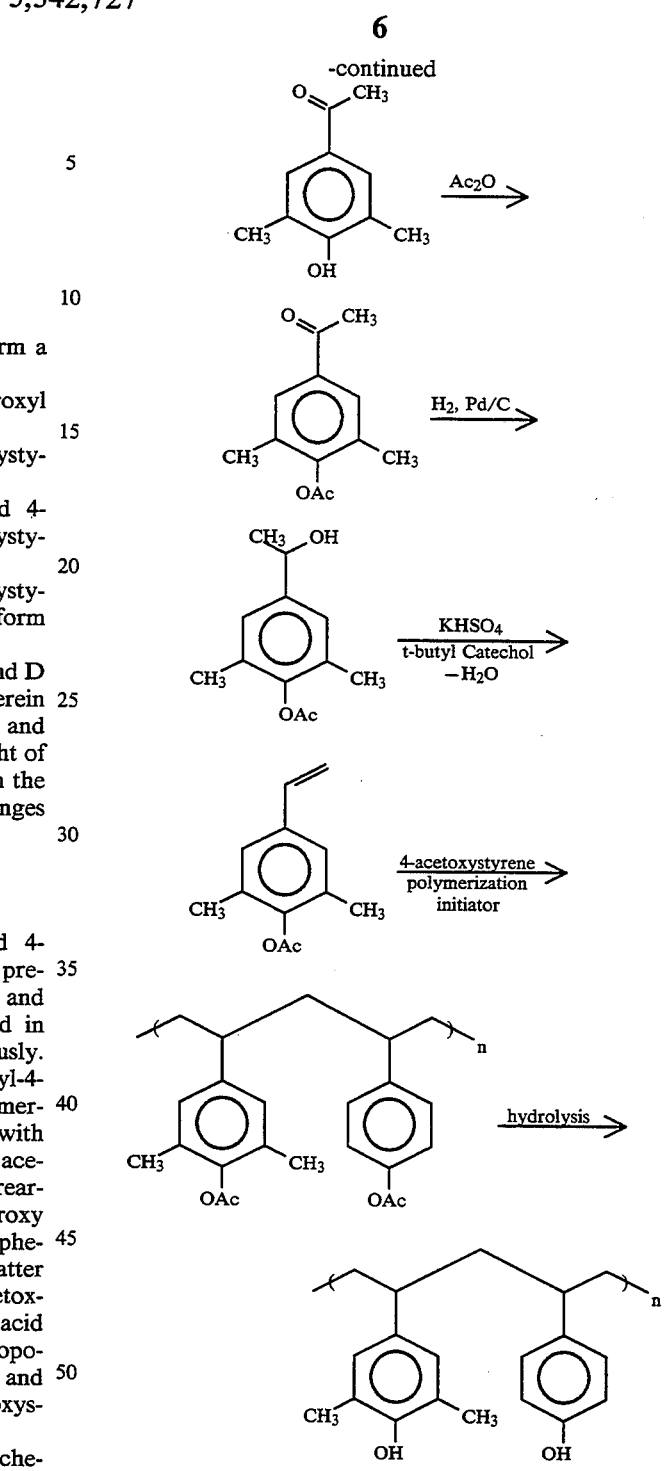

Alternatively one may begin by substituting a 4-hydroxyacetophenone and then proceeding with the esterification, etc.

In the preferred embodiment the first two reaction steps proceed essentially simultaneously. That is, one charges the reaction vessel with 2,6-dimethylphenol, a slight excess of acetic anhydride and a Friedel-Crafts catalyst such as hydrogen fluoride. The acylation is conducted at a temperature of from about 5° C. to about 100° C., or more preferably from about 20° C. to about 80° C. A most preferred temperature is about 50° C. The reaction proceeds at a preferred pressure of from about 700 mm Hg to about 780 mm Hg for from about 1 to about 5 hours. Although hydrogen fluoride is the preferred catalyst, others may be also used such as AlCl$_3$, H$_2$SO$_4$, BF$_3$, and SnCl$_4$. In the alternative, the acylation may be conducted by a Fries rearrangement, in a manner well known to the skilled artisan. Esterification of the hydroxyl group for its protection is preferably accomplished with acetyl chloride or with acetic anhydride. However, any reagents known to protect hydroxyl functions can be used. These include in particular the formation of ethers, such as methyl, methoxymethyl, 2-methoxyethoxymethyl, methylthiomethyl, tetrahydropyranyl, cyclopropylmethyl, allyl, isopropyl, cyclohexyl, t-butyl, benzyl, o-nitrobenzyl, 9-anthrylmethyl, and 4-picolyl ethers, but also silyl ethers, such as trimethylsilyl and t-butyldimethylsilyl ethers, esters such as acetates, pivaloates, benzoates, and 9-fluorenecarboxylates, carbonates such as methyl, 2,2,2-trichloroethyl, vinyl, and benzyl carbonates, arylcarbamates, and sulfonates such as methanesulfonates and toluenesulfonates. Protective groups of this type are described by Theodora W. Green, Protective Groups in Organic Synthesis, John Wiley & Sons, 1981. However, the acetoxy group is particularly preferred. The reaction product 3,5-dimethyl-4-hydroxyacetophenone is then esterified, with a suitable acylating agent, preferably with acetic anhydride. In this process, the 3,5-dimethyl-4-hydroxyacetophenone is refluxed with an excess of acetic anhydride for from about 15 to about 20 hours. Excess acetic anhydride as well as generated acetic acid are removed by distillation in vacuo. This is conducted, for example at a pressure of from about 15 to about 30 mm Hg and at a temperature of from about 15° C. to about 40° C., preferably from about 30° C. to about 35° C. The resultant 3,5-dimethyl-4acetoxyacetophenone is then preferably flash distilled at a pressure of from about 10 to about 40 mm Hg and at a temperature of from about 105° C. to about 125° C. and the resultant product appears as a colorless liquid which solidifies at room temperature.

The 3,5-dimethyl-4-acetoxyacetophenone is then catalytically hydrogenated. The reduction of the ketone function can be done with complex hydrides and by catalytic reduction with hydrogen. Sodium borohydride is a preferred complex hydride. Lithium borohydride is also possible as well as reaction products that arise for example upon dissolution of sodium borohydride or lithium borohydride in alcohols. The preferred reaction medium in reduction with complex hydrides is ethanol or mixtures of organic solvents miscible with water, such as THF/water mixtures.

In the preferred embodiment, an autoclave is first passivated, for example first with 30% HNO$_3$ and then with KOH/isopropanol. It is then charged with the 3,5-dimethyl-4-acetoxyacetophenone, an excess of hydrogen gas under pressure, a sufficient amount of a suitable catalyst to drive the reaction, and a suitable solvent. One preferred catalyst is Pd/C in an amount of from about 1 to about 4 percent by weight of the 3,5-dimethyl-4-acetoxyacetophenone. Other suitable catalysts non-exclusively include Pd/CaCO$_3$, Ni/Al, sodium borohydride and reduced metal salts of Pt, Pd and Ni. The preferred solvent is ethanol and is present in an amount of from about 3 to about 5 parts by weight of the 3,5-dimethyl-4-acetoxyacetophenone. The reaction proceeds at a preferred temperature of from about 25° C. to about 40° C., a preferred hydrogen gas pressure of from about 215 to about 250 mm Hg. The reaction is conducted for from about 1 to about 5 hours. The resultant product is 1-(3,5-dimethyl-4-acetoxyphenyl)ethanol and has the appearance of a colorless oil after filtering off the catalyst and evaporating the solvent.

This oil is then dehydrated. Dehydration is preferably conducted by vacuum heating the oil in the presence of a polymerization inhibitor and a dehydrating agent. In one preferred embodiment, the 1-(3,5-dimethyl-4-acetoxyphenyl)ethanol is mixed with a KHSO$_4$ dehydrating agent and a t-butyl catechol polymerization inhibitor. Other useful dehydrating agents non-exclusively include bases, CuSO$_4$, CuCl$_2$, Mg(ClO$_4$)$_2$ and aluminum oxide. Other polymerization inhibitors non-exclusively include hydroquinone, tetrachloroquinone and di-t-butyl-p-cresol. The dehydrating agent is present in an amount of from about 0.25 to about 5.0 percent weight of the oil. The polymerization inhibitor is preferably present in an amount of from about 0.01% to about 5% based on the weight of the oil. The reaction vessel is heated to from about 160° C. to about 210° C., preferably 185° C. to about 190° C. at a pressure of from about 1.0 to about 15 mm Hg, preferably 1.5 to 2.0 mm Hg. The product is then distilled to a colorless liquid and then redistilled after the insertion of additional polymerization inhibitor.

The 3,5-dimethyl-4-acetoxystyrene is then copolymerized with unsubstituted 4-acetoxystyrene.

The free radical polymerization process is conducted to produce the desired copolymer such that it has a molecular weight in the range of from about 800 to about 100,000, preferably 1,000 to 50,000 or more preferably about 5,000 to about 15,000.

One preferred free radical initiation is azo isobutyronitrile (AIBN). Other azo type initiators are also suitable. Still others non-exclusively include peroxides such as benzoyl peroxide, and di-t-butyl peroxide. It is predicted that essentially any free radical initiation system will serve in the same fashion.

The polymerization as such can be either radical or ionic, particularly cationic. Radical polymerization started by initiators such as azobisisobutyronitrile is particularly preferred. In addition, peroxides such as benzoyl peroxide and di-t-butyl peroxide are worthy of mention.

Polymerization can be either solution polymerization in which the monomers are dissolved in a solvent, or in bulk.

The poly(3,5-dimethyl-4-acetoxystyrene-co-4-acetoxystyrene) is then hydrolyzed to poly(3,5-dimethyl-4-hydroxystyrene-co-4-hydroxystyrene). One preferred hydrolyzing agent is tetramethyl ammonium hydroxide. Other hydrolyzing agents non-exclusively include aqueous NH$_3$, NaOH and KOH.

Possible hydrolyzing agents are HCl and H$_2$SO$_4$; basic hydrolysis is usually done with NH$_3$, HaOH, KOH and also with tetramethylammonium hydroxide.

In the preferred embodiment, the mol ratio of unsubstituted 4-hydroxystyrene to substituted 4-hydroxystyrene range from about 3:1 to about 1:3; or more preferably from about 2:1 to about 1:2 and most preferably from about 1:1.

In the production of the photosensitive composition and photographic element of this invention, one blends the above produced binding resin with a sensitizer such as an o-quinone diazide photosensitizer with a suitable solvent until a homogeneous solution is formed. The solution is then coated on a suitable substrate and dried until it is non-tacky.

The use of o-quinone diazides is well known to the skilled artisan as demonstrated by *Light Sensitive Sys-* tems, Kosar, J.; John Wiley & Sons, New York, 1965 in Chapter 7.4 which is also incorporated herein by reference. These sensitizers which comprise a component of the present resist compositions of the present invention are preferably selected from the group of substituted naphthoquinone diazide sensitizers which are conventionally used in the art in photoresist formations. Such sensitizing compounds are disclosed, for example, in U.S. Pat. Nos. 2,797,213; 3,106,465; 3,148,983; 3,130,047; 3,201,329; 3,785,825; and 3,802,885, which are incorporated herein by reference.

The photosensitizer is preferably a 1,2 quinone diazide-4 or 5-sulfonic acid ester of a phenolic derivative. It presently appears that the number of fused rings is not important for this invention but the position of the sulfonyl group is important. That is, one may use benzoquinones, naphthoquinones or anthroquinones as long as the oxygen is in the 1 position, diazo is in the 2 position and the sulfonyl group is in the 4 or 5 position. Likewise the phenolic member to which it is attached does not appear to be important. For example it can be a cumylphenol derivative as taught in U.S. Pat. No. 3,640,992 or it can be a mono-, di-, or tri-hydroxyphenyl alkyl ketone or benzophenone as shown in U.S. Pat. No. 4,499,171. Both of these patents are incorporated herein by reference.

Useful photosensitizers include (1,2)-naphthoquinonediazide-4-sulfonyl chloride, condensed with phenolic compounds such as hydroxy benzophenones especially trihydroxybenzophenone and more particularly 2,3,4-trihydroxybenzophenone; 2,3,4,-trihydroxyphenyl pentyl ketone 1,2-naphthaquinone-2-diazide 4-sulfonic acid triester or other alkyl phenones; 2,3,4-trihydroxy-3'-methoxy benzophenone 1,2-naphthaquinone-2-diazide-4-sulfonic acid triester; 2,3,4-trihydroxy-3'-methyl benzophenone 1,2-naphthaquinone-2-diazide-4-sulfonic acid triester; and 2,3,4-trihydroxybenzophenone 1,2-naphthaquinone diazide-4-sulfonic acid triester.

The invention also provides a radiation-sensitive mixture, which contains a compound that forms an acid (starter) under the action of actinic radiation together with an acid sensitive species as described in U.S. Pat. Nos. 4,491,628 and 4,101,323 which are incorporated herein by reference. Other useful sensitizers include onium salts such as those described in U.S. Pat. Nos. 3,981,897 and 4,450,360 which are incorporated herein by reference.

Photosensitizers also non-exclusively include azides, diazoketones, trihalotriazines, negative working diazonium salts and bisazides. Three component systems including an acid generator, onium salt and inhibitor are also within the scope of this invention. Such compounds and mechanisms are well known to the skilled artisan.

The three component resist system is particularly remarkable because it has a significant induction period before development. This effect is very significant for achieving high contrast, for example, diazonaphthoquinone/novolac resists. No induction period was observed for the same resist system in novolac resin.

The photosensitive composition is formed by blending the ingredients in a suitable solvent composition. In the preferred embodiment the resin is preferably present in the overall composition in an amount of from about 75% to about 99% based on the weight of the solid; i.e. non-solvent parts of the composition. A more preferred range of resin would be from about 80% to about 90% and most preferably from about 82% to about 85% by weight of the solid composition parts. The photosensitizer is preferably present in an amount ranging from about 1% to about 25% based on the weight of the solid, i.e., non-solvent parts of the composition. A more preferred range of the photosensitizer would be from about 1% to about 20% and more preferably from about 10% to about 18% by weight of the solid composition parts.

In manufacturing the composition the resin and sensitizer are mixed with such solvents as diglyme, propylene glycol alkyl ether acetate, butyl acetate, xylene, ethylene glycol monoethyl ether acetate, propylene glycol monomethyl ether, propylene glycol monomethyl ether acetate, methoxypropyl acetate, cyclohexanone, methylisobutyl ketone and the like and mixtures thereof.

Preferably the radiation-sensitive mixture according to the invention is dissolved in solvents such as ethylene glycol, glycol ethers such as glycol monomethyl ether, glycol dimethyl ether, glycol monoethyl ether or propylene glycol monoalkyl ethers, in particular propylene glycol methyl ether; aliphatic esters such as ethyl acetate, hydroxyethyl acetate, alkoxyethyl acetate, n-butyl acetate, propylene glycol monoalkyl ether acetate, in particular propylene glycol methyl ether acetate or amyl acetate; ethers such as dioxane, ketones such as methyl ethyl ketone, methyl isobutyl ketone, cyclopentanone and cyclohexanone; dimethylformamide, dimethylacetamide, hexamethylphosphoramide, N-methylpyrrolidone, butyrolactone, tetrahydrofuran, and in mixtures thereof. Glycol ethers, aliphatic esters, and ketones are particularly preferred.

The solutions produced with the components of the radiation-sensitive mixture according to the invention usually have solid contents of 5 to 60 wt. %, preferably up to 50 wt. %.

Additives such as colorants, dyes, anti-striation agents, plasticizers, adhesion promoters, speed enhancers, solvents and such surfactants as non-ionic surfactants may be added to the solution of resin, sensitizer and solvent before the solution is coated onto a substrate.

In addition, pigments, softeners, wetting agents, and flow-control agents, also polyglycols, cellulose ethers, e.g. ethylcellulose, can be added to the radiation-sensitive mixtures according to the invention to improve special requirements such as flexibility, adhesion, and gloss. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of resin and sensitizer. The dye additives help provide increased resolution by inhibiting back scattering of light off the substrate.

Anti-striation agents may be used up to a five percent weight level, based on the combined weight of resin and sensitizer. Plasticizers which may be used include, for example, phosphoric acid tri-(beta-chloroethyl)-ester; stearic acid; dicamphor; polypropylene; acetal resins; phenoxy resins; and alkyl resins at one to ten percent weight levels, based on the combined weight of resin and sensitizer. The plasticizer additives improve the coating properties of the material and enable the application of a film that is smooth and of uniform thickness.

Development speed enhancers that may be used include, for example, picric acid, nicotinic acid or nitrocinnamic acid at a weight level of up to 20 percent, based on the combined weight of resin and sensitizer. These enhancers tend to increase the solubility of the photoresist coating in both the exposed and unexposed areas, and thus they are used in applications when speed of development is the overriding consideration even though some degree of contrast may be sacrificed. That is, while the exposed areas of the photoresist coating will be dissolved more quickly by the developer, the speed enhancers will also cause a larger loss of photoresist coating from the unexposed areas.

Free radical initiators such as di (trichloromethyl) stibenyl triazine and 1,1,1-trichloro-t-butyl acetophenone generate acid functionality upon exposure. They can therefore enhance exposure plus provide free radicals for cross-linking the image when baking afterward.

Non-ionic surfactants that may be used in the solution containing the light-sensitive composition of this invention include, for example, nonylphenoxy poly (oxyethylene) ethanol; octylphenoxy poly(oxyethylene) ethanol; and dinonyl phenoxy poly (oxyethylene) ethanol at up to 10 percent weight levels, based on the combined weight of resin and sensitizer.

The prepared photosensitive solution can be applied to a substrate to form a photoresist by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process.

The support for preparing the photoresist of this invention may be any suitable support such as a metal which may be electrochemically or mechanically roughened, such as aluminum and its alloys; plastic films such as polyester or polyolefin; wood; paper; semiconductor materials (i.e., materials which are not conductive unless and until they are doped) such as silicon, gallium arsenide; ceramics; and textiles. Preferably, the support is a silicon-based wafer.

All materials of which capacitors, semiconductors, multilayer printed circuits, or integrated circuits consist or from which they can be made are candidates for substrates. Particular candidates are surfaces of pure silicon and thermally oxidized and/or aluminum-coated silicon materials which may also be doped, including all other substrates usually found in semiconductor technology such as silicon nitride, gallium arsenide, and indium phosphide. Other possibilities are substrates known from liquid crystal displays such as glass and indium stannic oxide; also metal plates and films made for example of aluminum, copper, or zinc; bimetallic and trimetallic films, also electrically non-conducting metallized films or, if applicable, aluminum-coated $SiO_2$ materials and paper. These substrates may be subjected to heat pretreatment, be surface-roughened, etched, or treated with chemicals to improve desired properties, e.g. to increase hydrophilicity.

Examples of substrates that may be used to make photomechanical recording layers such as printing forms for letterpress, offset, screen printing, and gravure as well as relief copies are aluminum plates, which may be anodized, granulated and/or silicatized aluminum plates, zinc plates, steel plates, possibly treated with chromium, as well as plastic film or paper.

The photoresist coatings produced by the above described procedure are particularly suitable for application to thermally grown silicon/silicon dioxide-coated wafers such as are utilized in the production of microprocessors and other miniaturized integrated circuit components. The substrate may also comprise various polymeric resins especially transparent polymers such as polyesters. The substrate most preferably comprises doped silicon dioxide, silicon nitride, tantalum, copper, polysilicon, ceramics and aluminum/copper mixtures.

After the photosensitive composition solution is coated onto the substrate, the substrate is baked at approximately 80° to 100°, until substantially all of the solvent has evaporated and only a thin coating of photoresist composition on the order of a micron in thickness remains on the substrate. The coated substrate can then be exposed to actinic radiation especially ultraviolet radiation in the range of about 240 nm to about 450 nm, produced by use of suitable photomasks, negatives, stencils, templates, projection means, etc. In a more preferred embodiment the u.v. exposure range is from about 248 nm to about 436 nm.

The recording material according to the invention is irradiated in the pattern of an image. Sources of actinic radiation are: metal halide lamps, carbon arc lamps, xenon lamps and mercury vapor lamps. Irradiation with high-energy radiation such as excimer laser, electron beam, ion beam, or x-radiation is preferred.

The layer thickness varies depending on its application. It amounts to 0.1 to 100 microns, particularly 1 to 10 microns.

Application of the radiation-sensitive mixture to the substrate can be accomplished by spraying, flow coating, rolling, centrifugal coating, and dip coating. After this, the solvent is removed by evaporation so that the radiation-sensitive layer remains behind on the surface of the substrate. The mixture can however first be applied in the above-mentioned fashion to an intermediate substrate, after which it is transferred to the final substrate material under pressure and at an elevated temperature. Essentially all materials suitable as substrate materials can be used for the intermediate substrate. The layer is then irradiated in the pattern of the image. High-energy radiation such as x-rays or electron radiation are particularly preferred. High-energy Synchrotron radiation with doses of 20 to 200 mJ/cm or radiation of an electron beam exposure tool is particularly preferred. In the radiation-sensitive layer, an image pattern is then revealed by development by treating the layer with a developer solution which dissolves or removes the irradiated zones of the material.

The exposed resist-coated substrates are usually developed by immersion in an alkaline developing solution, such as potassium based aqueous alkaline solution such as AZ 400K available from Hoechst Celanese Corporation of Somerville, N.J. The solution is preferably metal ion free. In use the developer is agitated, for example, by nitrogen burst agitation. The substrates are allowed to remain in the developer until all, or substantially all, of the resist coating has dissolved from the exposed areas. Solutions of alkaline reagents such as silicates, metasilicates, hydroxides, hydrogen or dihydrogen phosphates, carbonates or hydrogen carbonates, in particular alkali metal ions or ammonium ions, but also ammonia and the like are used as developers. The content of these substances in the developer solution generally amounts to 0.1 to 15 wt. %, preferably 0.5 to 5 wt. % based on the weight of the developer solution.

After removal of the coated wafers from the developing solution, a post-development heat treatment or bake may be employed to increase the coating's adhesion and chemical resistance to etching solutions and other substances as taught by British Pat. No. 1,154,749. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid etching solution. The resist compositions of the present invention are resistant to such etching solutions and provide effective protection for the unexposed resist-coated areas of the substrate.

In the preferred embodiment the developed resist structures may be hardened by heating a resist structure on a hot plate up to a point just below the flow temperature and then exposing the entire surface with UV light from a xenon-mercury vapor lamp (range 200 to 250 nm). This hardening cross-links the resist structures so that the structures usually have flow resistance up to a temperature of over 200° C. Hardening can also be done without high temperatures, merely by irradiating with UV light. This is particularly the case when a high-energy particle beam exposure such as electron radiation is used.

It is known in the art that photosensitive compositions of the above described type are of positive working variety. However, this invention is not so limited and is particularly suitable as a so-called image-reversal photoresist where by suitable other ingredients or processing steps which are known in the art a negative image may be obtained. For example, one may include suitable crosslinking agents in the photosensitive composition. Non-exclusive examples of crosslinking agents and processes are hexamethylol melamine ether as taught in U.S. Pat. No. 4,581,321; as well as crosslinking agents and processes taught in U.S. Pat. Nos. 4,104,070; 4,196,003, 4,576,901 and 4,506,006; as well as the dimethylol paracresol and other classes of crosslinkers taught in U.S. patent application Ser. No. 06/895,609 all of which are incorporated herein by reference. The herein claimed substituted hydroxystyrene and acetoxystyrene polymers may be substituted for the alkali soluble binding resins taught in these references. The crosslinking compound is a compound, which when in the presence of that amount and strength of acid generated when the diazide is exposed, is capable of crosslinking the polymer. This occurs upon the application of sufficient heat to diffuse the acid to the crosslinking component but less heat than will decompose the diazide. The generally preferred class of such compounds are those capable of forming a carbonium ion under the foregoing acid and heat conditions. Crosslinkers particularly suitable for use in the present invention non-exclusively include those having the general formula:

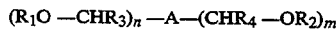

wherein A has the formula B—Y—B wherein B is a substituted or unsubstituted mononuclear or fused polynuclear aromatic hydrocarbon or an oxygen or sulfur containing heterocyclic compound, Y is a single bond, $C_1C_4$ -alkylene or alkylenedioxy, the chains of which may be interrupted by oxygen atoms, —O—, —S—, —SO$_2$—, —CO—, —CO$_2$—, —O—CO$_2$—, —CONH—, or phenylenedioxy; $R_1$ and $R_2$ are H, $C_1$-$C_6$-alkyl, cycloalkyl, substituted or unsubstituted aryl, alkaryl or acyl; $R_3$, $R_4$ are independently H, $C_1$-$C_4$ alkyl or substituted or unsubstituted phenyl and n ranges from 1 to 3 and m ranges from 0-3, provided that n+m is greater than 1. The crosslinker would preferably be present in the photographic composition in an amount of from about 0.5% to about 20%, more preferably about 1% to about 10% based on the solid components of the photographic composition. In the most preferred embodiment, when image reversal is desired, a 1,2 naphthoquinone-2-diazide-4-sulfonyl containing isomer is employed as the photosensitizer. The 4-isomer has been found to generate more acid than the corresponding 5-isomer and hence is more desirable for image reversal techniques. In one image reversal mode, the photosensitive composition is coated upon a suitable substrate as hereinbefore described, and is dried until it is non-tacky, for example by heating at approximately 20° to 100° C. for from 30 seconds to about 3 minutes. It is then exposed to imaging energy of any desired pattern in a manner well known to the skilled artisan. The resist is then subjected to a post exposure baking of from about 95° C. to about 160° C. or more preferably 112° C. to about 120° C, for from about 10 seconds to the time necessary to crosslink the resin. This may range from about 10 to about 90 seconds. After baking one may perform an optional overall flood exposure. The exposed resist is then developed in a suitable developer until substantially all of the non-image areas of the resist have been removed. Suitable developers non-exclusively include aqueous solutions of sodium hydroxide, and tetramethyl ammonium hydroxide as are well known in the art. The developed resist may optionally be heat treated again.

The following examples are illustrative of the invention but it is understood that the invention is not limited thereto.

EXAMPLE 1

3,5-Dimethyl-4-Acetoxystyrene (36.6 g, 0.30 mol) of 2,6-dimethylphenol are mixed in an Hastelloy C autoclave with 0.315 mol of acetic anhydride and 9 mols of hydrogen flouride. The temperature is raised to 50° C. and the reaction runs for 3 hours. After extraction and wash, 47.4 g of a gray to purple solid mass of 3,5-dimethyl4-hydroxyacetophenone is obtained. This solid is then esterified by refluxing with 4 mols of acetic anhydride for 19 hours. After removal of acetic acid and acetic anhydride by vacuum distillation the 3,5-dimethyl-4-acetoxyacetophenone is flash distilled to yield 47.7 g of a slightly yellow liquid. 0.1 mol of the 3,5-dimethyl-4-acetoxyacetophenone, 1.2 g of 5% Pd/C as catalyst and 100 ml ethanol are mixed in an autoclave and the autoclave is charged with hydrogen gas at a pressure of 215–220 mm Hg and the reaction is run for about 2½ hours at a temperature of about 25°–30° C. Additional catalyst is added as needed. The catalyst is then removed and the ethanol evaporated to yield 21.5 g of a colorless oil which is (3,5-dimethyl-4-acetoxyphenyl)ethanol. 0.168 mol of (3,5-dimethyl-4-acetoxyphenyl)ethanol is added to a flask with 0.35 g KHSO$_4$ and 0.5 g t-butyl catechol. The flask is heated to 185 to 190° C. at 1.5 to 2.0 mm Hg. A colorless liquid is distilled. After the addition of 0.15 g of t-butyl catechol, and redistillation, 26.1 g of 3,5- dimethyl-4-acetoxystyrene monomer is produced. The compound has a boiling point of 90°–91° C. at 0.5 mm of Hg and the yield is 81.8%.

EXAMPLE 2

Poly(3,5-Dimethyl-4-Hydroxystyrene-Co-4-Hydroxystyrene)

3,5-Dimethyl-4-acetoxystyrene (21.5g, 0.11 mol) and 4-acetoxystyrene (18.3 g, 0.11 mol) are dissolved in THF (distilled over sodium/benzophenone). The solution is degassed with nitrogen for 30 minutes. AIBN (1.6 g, 4 wt %) is added as an initiator. The polymerization is then carried out at 70° C. for 20 hours under nitrogen. The polymer is isolated by precipitating into absolute ethanol and filtering. The polymer is allowed to dry on the filter.

Hydrolysis

The dried polymer (35 g) is suspended in absolute ethanol (250 mL) and concentrated HCl (4 mL) added. The suspension is heated at reflux. The polymer goes into solution after a short time at reflux (indicating hydrolysis is occurring). The hydrolysis is followed by removing samples from the reaction flask and analyzing them by FT-IR (disappearance of the peak at 1760 cm$^{-1}$). Hydrolysis is complete in about 3 hrs. The copolymer is isolated by precipitating into water, filtering, and drying in a vacuum oven for 24 hrs at 50° C. Yield (20 g, 77%).

| GPC analysis: | Mw = 6525 |
| --- | --- |
|  | Mn = 4950 |
|  | D = 1.33 |
| Thermal analysis: | $T_g$ = 162° C. |
|  | $T_d$ = 380° C. |
| UV analysis: | lambda$_{max}$ = 278 nm in abs. EtOH |

$^{13}$C—NMR: Integration of peaks at 151.67 ppm and 155.84 ppm gives a mole ratio of 53% to 47% of the hydroxystyrene to the dimethyl hydroxystyrene in the final polymer.

EXAMPLE 3

3,5-Dimethyl-4-acetoxystyrene (40 g, 0.21 mol) and acetoxystyrene monomer (34 g, 0.21 mol) are dissolved in degassed THF (200 ml). The solution is heated at 70° C. for 6 hours under N$_2$. The polymer is isolated by precipitating into methanol. The polymer is filtered and dried in a vacuum. The polymer is dissolved in THF (200 ml) and methanol (20 g, excess) and HCl (0.74 g, 1 wt %) and heated to reflux. Samples of polymer are withdrawn for FTIR. The polymer is precipitated into water, filtered and dried.

| GPC analysis: | Mw = 14,800 |
| --- | --- |
|  | Mn = 10,360 |
|  | D = 1.47 |
|  | $T_g$ = 167.1° C. |
|  | $T_d$ = 382° C. |
| Yield: | 37$_g$ (65%) |

EXAMPLE 4

Example 1 is repeated with 3,5-dimethyl-4-acetoxystyrene (10.15 g, 0.053 mol), 4-acetoxystyrene monomer (8.65 g, 0.053 mol) and AIBN (0.188 g, 1 wt %). The following analysis is noted.

| GPC analysis: | Mw = 37,839 |
| --- | --- |
|  | Mn = 19,500 |
|  | D = 1.94 |

EXAMPLE 5

A resist is formulated by dissolving diazonaphthoquinone sensitizer of the formula

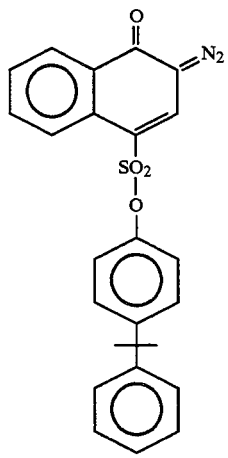

and poly(3,5-dimethyl-4-hydroxystyrene-co-4-hydroxystyrene) in propylene glycol monomethyl ether acetate. Films prepared from this solution are readily imaged by exposure to long wavelength radiation (365 nm) followed by development with dilute tetramethylammonium hydroxide solutions. Resist films are also exposed on the Perkin Elmer 500 scanning projection tool with UV-4 filter and developed.

EXAMPLE 6

A resist is formulated by blending poly(3,5-dimethyl-4-hydroxystyrene-co-4-hydroxystyrene) with 12% weight percent of the following diazopiperidinedione:

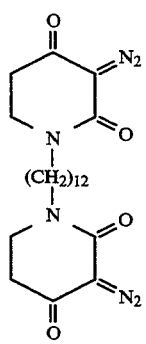

Films of this admixture are irradiated at 254 nm and then developed with diluted AZ2401 developer which is commercially available from Hoechst Celanese Corporation, Somerville, N.J. The contrast of the resist in the copolymer is approximately 1.6 which is improved relative to the contrast observed for resist films containing this sensitizer in novolac (gamma=1.3). Perkin-Elmer 500 exposures are also carried out in the UV-2 mode. The corresponding images of the resist system in novolac are also produced and the improvement in image quality is evident upon exposure of both systems at the same scan speed.

EXAMPLE 7

A resist is formulated by dissolving 15 parts of inhibitor:

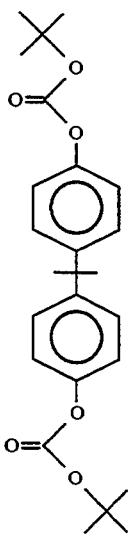

5 parts of onium salt $Ph_3S^+As F_6^-$ and 100 parts of the resin of poly(3,5-dimethyl-4-hydroxystyrene-co-4-hydroxystyrene). A sensitivity of 2.0 mJ/cm² is observed as compared to 3.5 mJ/cm² for similar system where a novolac resin is substituted for the copolymer. Moreover, the contrast of this copolymer system appears to be greatly improved. A contrast of greater than 3.0 is observed while the contrast in novolac is less than 2.0.

EXAMPLE 8

Diazonaphthoquinone Sensitizers

A formulation is prepared by dissolution of 1,275 g of 4-(2-phenylpropyl)phenyl-3-diazo-3,4-dihydro-4-oxo-naphthalenesulfonate and 6.225 g of polymer prepared from polymerization of 1 part 4-vinylphenol and 1 part 2,6-dimethyl-4-vinylphenol (Polymer I). The casting solvent is methoxypropyl acetate. Films of approximately 1 micrometer thickness are spin-coated and baked at 80° C. for 15 minutes. The films are exposed on a Perkin Elmer 500 Micralign Exposure Station in the UV-4 mode with a scan speed of 5000 and then developed with a commercial aqueous base developer. Resolution of 1 micrometer resist images can be obtained.

Diazoketone Sensitizers

A formulation is prepared consisting of 0.25 g 1,12-bis-(3-diazo-2,4-dioxopiperid-1-yl)dodecane, 1.83 g of Polymer I, and 8.3 g of methoxypropyl acetate. One micron films are prepared by spin-coating of these solutions followed by a 5 minute bake at 90° C. The films are exposed on the Perkin Elmer 500 Micralign tool at scan speed 45,000 in the UV-2 mode. Development is carried out with a dilute commercial aqueous base developer and one micron features are resolved.

Onium Salt Sensitizers

A solution is prepared containing 0.15 g bis-2,2-(4-t-butyloxycarbonyloxyphenyl)propane, 0.05 g triphenylsulfonium hexafluoroantimonate, 1.0 g Polymer I, and 5.0 g of methoxypropyl acetate. Films of this resist are prepared by spin-coating followed by a 90° C. bake for 5 minutes. The films are exposed at 254 nm with a dose range of 2-10 mJ/cm². Film dissolution analysis is carried out using quartz crystal microbalance techniques. The dissolution data is used to compute the resist contrast (gamma=3.2).

EXAMPLE 9

Polymers are prepared by free-radical polymerization of 3-methyl or 2-methyl-4-acetoxystyrene, respectively, and converted to base soluble free phenolic polymers by deprotection with methanol/HCl. GPC vs. polystyrene gives comparable MW (20-23,000). NMR and IR data confirm the purity and complete deprotection of the polymers.

20% solutions of the polymers are spin-coated onto Si-wafers, dried at 110° C. for 1 minute on a hot plate, and the dissolution rate of the pure polymer measured by immersing the wafers in an aqueous-alkaline developer solution. The film removal rates are obtained by noting the time after which the film has been completely removed, and dividing the previously measured film thickness by this time. Thus, are obtained film removal rates of the following in a tetramethylammonium hydroxide solution:

| | poly(3-methyl-4-hydroxystyrene) | poly(2-methyl-4-hydroxystyrene) |
|---|---|---|
| AZ Developer 0.27N (tetramethylammonium hydroxide solution) | <100 nm | 4225 nm/min |
| 0.27N | 319 | 9550 |
| 0.20N | 80 | — |
| 0.17N | 47 | 1207 |

(for comparison: poly(hydroxystyrene) (PHS) in 0.27 N MIF: ca. 18,000 nm/min.

Compositions are made up from 77% by weight of solids of either 2- or 3-methyl derivative polymer, and 23% by weight of solids of a mixture of 2,1-diazonaphthoquinone-5-sulfonic acid benzophenone mono- to tris-ester, as is commonly used in novolak type resists, and sufficient propylene glycol monomethyl ether acetate (PGMEA) to make up a 23-25% solution. Wafers are dried for 1 minute at 90° C. on a hot plate prior to exposure, and for 1 minute at 100° C. after exposure. Development is effected for 60 seconds in tetramethylammonium hydroxide, metal ion free (MIF) solutions of a concentration commonly used in the semiconductor industry. The dry film loss observed is as follows:

| Normality of MIF | poly(3-methyl-4-hydroxystyrene) | poly(2-methyl-4-hydroxystyrene) |
|---|---|---|
| 0.27N | 1057 nm/min | >>1102 nm/min |
| 0.20 | 183 | 1150 |
| 0.17 | 78 | 551 |

Exposure of wafers on a Canon g-line stepper followed by development gives the following results: For the 3-methyl derivative, 1:1 structure transfer for 1 um lines is obtained for an exposure at 190 mJ/cm² followed by a 60 second development in 0.20N MIF. Development in 0.17N MIF results in low film speed (>400 mJ/cm²), and development in 0.27N MIF gives no useful structures due to high dark film loss. For the 2-methyl derivative, no useful structures can be obtained even for the 0.17N developer. Due to high dark film loss, the remaining resist lines show severely sloped sidewalls visible even in the optical microscope. The $T_g$ values for the 3-methyl derivative is determined to be 135° C., and that of the 2-methyl derivative to be 153° C. Comparison with polyhydroxystyrene ($T_g$ ca. 175° C.) again shows the 2-methyl derivative to be PHS-like, and the 3-methyl derivative to be novolak-like ($T_g$ of commercially used novolaks: from 105° C. to 130° C.).

In summary, 3-methyl-4-hydroxystyrene polymer is a much better match to the properties of novolak and the demands of a semiconductor patterning process than the 2-methyl derivative, which resembles PHS in its behavior. From this one can conclude that copolymers of 4-hydroxystyrene with 2-methylhydroxystyrene would be unsuitable for photoresist production whereas copolymers of 4-hydroxystyrene with 3- or 5-methylhydroxystyrenestyrene or 3,5-dimethylhydroxystyrene would be suitable for photoresist production. As long as there is substitution in the 3-, 5-, or 3,5- positions, then further substitution at the 2- or 6- positions may take place, but does not appear to help or hinder the copolymer in its usefulness as a photoresist binder.

What is claimed is:

1. A photosensitive composition which comprises in admixture:

a photosensitizer in an amount sufficient to provide an imagewise differentiation when the composition is coated on a substrate and imagewise exposed to actinic radiation; and a binder in an amount sufficient to bind the composition ingredients into a substantially uniform admixture, wherein said binder comprises:

a copolymer of (a) an unsubstituted 4-hydroxystyrene monomer and (b) a substituted 4-hydroxystyrene monomer of the formula

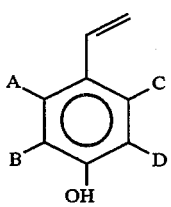

wherein A, B, C and D are independently H or $C_1$ to $C_4$ alkyl and wherein at least one of B and D is $C_1$ to $C_4$ alkyl; and wherein said copolymer has a molecular weight of from about 800 to about 100,000; and wherein the mol ratio of monomer (a) to monomer (b) ranges from about 3:1 to about 1:3.

2. The composition of claim 1 wherein when A, B, C or D are alkyl, they are $C_1$ to $C_3$ alkyl.

3. The composition of claim 1 wherein monomer (b) is 3,5-dimethyl-4-hydroxystyrene.

4. The composition of claim 1 wherein monomer (b) is 3,5-dimethyl-4-hydroxystyrene; and the mol ratio of monomer (a) to monomer (b) is about 1:1; and the molecular weight of the copolymer ranges from about 5,000 to about 15,000.

5. The composition of claim 1 wherein the photosensitizer is a compound which generates an acid upon exposure to actinic radiation.

6. The composition of claim 1 wherein the photosensitizer is an o-quinone diazide.

7. The composition of claim 1 wherein the photosensitizer is selected from the group consisting of diazo compounds, bisazides and onium salts.

8. The composition of claim 1 wherein the photosensitizer is a photosensitive composition comprising an onium salt and a dissolution inhibitor.

9. The composition of claim 8 further comprising a compound capable of generating an acid upon exposure to actinic radiation.

10. The composition of claim 1 wherein said photosensitizer is the condensation product of a naphthoquinone-(1,2)-diazide-(2)-4 or 5-sulfonyl compound with a hydroxybenzophenone.

11. The composition of claim 1 wherein the ratio by weight of said polymer to said photosensitizer is in the range of from about 1:1 to about 20:1.

12. The composition of claim 1 further comprising one or more additives selected from the group consisting of colorants, dyes, anti-striation agents, plasticizers, adhesion promoters, speed enhancers, solvents and surfactants.

13. The composition of claim 1 further comprising a crosslinking agent.

14. The composition of claim 13 wherein said crosslinking agent is dimethylol paracresol.

15. A photographic element which comprises the dried composition of claim 1 coated on a support.

16. A photographic element which comprises the composition of claim 11 coated on a support.

17. The photographic element of claim 15 wherein said support comprises one or more materials selected from the group consisting of a semiconductor material, a metal, a plastic film, wood, paper, ceramics and textiles.

18. The photographic element of claim 15 wherein said support comprises one or more materials selected from the group consisting of polyester, polyolefin, silicon, gallium arsenide, silicon/silicon dioxide, doped silicon dioxide, silicon nitride, aluminum/copper mixtures, tantalum, copper, polysilicon and aluminum.

* * * * *